(12) United States Patent
Fisk et al.

(10) Patent No.: US 7,812,691 B1
(45) Date of Patent: Oct. 12, 2010

(54) FUNCTIONALLY GRADED COATINGS FOR LEAD WIRES IN MEDICAL IMPLANTABLE HERMETIC FEEDTHROUGH ASSEMBLIES

(75) Inventors: Andrew E. Fisk, Philadelphia, PA (US); Richard X. Fu, Ellicott City, MD (US); Christine A. Frysz, Orchard Park, NY (US)

(73) Assignee: Greatbatch Ltd., Clarence, NY (US)

( * ) Notice: Subject to any disclaimer, the term of this patent is extended or adjusted under 35 U.S.C. 154(b) by 172 days.

(21) Appl. No.: 12/267,932

(22) Filed: Nov. 10, 2008

Related U.S. Application Data (60) Provisional application No. 60/986,304, filed on Nov. 8, 2007.

(51) Int. Cl.
H03H 7/00 (2006.01)
(52) U.S. Cl. .................................... 333/182
(58) Field of Classification Search ............... 333/182; 174/68.1, 102 A, 126.2, 255, 262, 264, 360, 174/388, 650
See application file for complete search history.

(56) References Cited

U.S. PATENT DOCUMENTS

| | | | |
|---|---|---|---|
| 2,303,497 A | 12/1942 | Reeve | |
| 2,947,069 A | 8/1960 | Carlson et al. | |
| 3,065,533 A * | 11/1962 | Dungan et al. | 228/121 |
| 3,432,278 A | 3/1969 | Richards | |
| 3,627,561 A | 12/1971 | Richards | |
| 3,648,355 A | 3/1972 | Shida et al. | |
| 3,854,891 A | 12/1974 | Chivinsky | |
| 4,042,753 A | 8/1977 | Smith | |
| 4,103,416 A | 8/1978 | Sakamoto | |
| 4,646,197 A | 2/1987 | Wong | |
| 5,100,486 A | 3/1992 | Krikorian et al. | |
| 5,364,706 A | 11/1994 | Toyofuku et al. | |
| 5,531,003 A * | 7/1996 | Seifried et al. | 29/25.42 |
| 5,571,332 A | 11/1996 | Halpern | |
| 5,925,470 A | 7/1999 | Blanyer et al. | |
| 5,932,372 A | 8/1999 | Rendina | |
| 6,027,822 A | 2/2000 | Blanyer et al. | |
| 6,051,326 A | 4/2000 | Fife | |
| 6,284,389 B1 | 9/2001 | Jones et al. | |
| 6,503,575 B1 * | 1/2003 | Payne et al. | 427/447 |
| 6,517,645 B2 | 2/2003 | Fife | |
| 7,564,674 B2 * | 7/2009 | Frysz et al. | 361/302 |
| 2002/0117330 A1 | 8/2002 | Eldridge et al. | |
| 2007/0134985 A1 | 6/2007 | Frysz et al. | |

* cited by examiner

Primary Examiner—Robert Pascal
Assistant Examiner—Kimberly E Glenn
(74) Attorney, Agent, or Firm—Michael F. Scalise (57) ABSTRACT

A feedthrough filter capacitor assembly is described. The feedthrough filter capacitor assembly comprises an outer ferrule hermetically sealed to an insulator of a dielectric material seated within the ferrule. The insulative material is also hermetically sealed to at least one lead wire. Instead of being made of platinum or platinum/iridium, the lead wire comprises a core of a non-noble metal supporting a functionally graded coating. The metal core has an inner layer of the same the non-noble metal of the core and an outer layer of a noble metal. A gradient transition zone exists between the non-noble metal and the outer noble metal. Consequently, lead wires having all the beneficial attributes of platinum and platinum/iridium wire can be built into hermetic feedthroughs, but at a significantly reduced cost. In a preferred form, a filter capacitor is mounted on the insulator and electrically connected to the lead wires and to the ferrule to prevent unwanted EMI signals from traveling along the wires and entering the interior of the medical device.

29 Claims, 5 Drawing Sheets

FUNCTIONALLY GRADED COATINGS FOR LEAD WIRES IN MEDICAL IMPLANTABLE HERMETIC FEEDTHROUGH ASSEMBLIES

CROSS-REFERENCE TO RELATED APPLICATION

This application claims priority from provisional application Ser. No. 60/986,304, filed Nov. 8, 2007.

BACKGROUND OF THE INVENTION

1. Field of the Invention

The present invention relates generally to hermetic feedthrough assemblies, preferably of the type incorporating a filter capacitor. More specifically, this invention relates to a method for producing lower cost lead wires for use in hermetic feedthrough filter capacitor assemblies. Preferably, the feedthrough filter capacitor assemblies are of the type used in implantable medical devices such as cardiac pacemakers, cardioverter defibrillators, and the like, to decouple and shield internal electronic components of the medical device from undesirable electromagnetic interference (EMI) signals. The feedthrough assemblies provide a hermetic seal that prevents passage or leakage of fluids into the medical device. The lead wires and, consequently the hermetic feedthrough assemblies, are considerably less expensive than those made by the prior art using platinum, platinum/iridium lead wires while still achieving the same benefits of biocompatibility, providing good mechanical strength and achieving a hermetic feedthrough seal.

2. Prior Art

Implantable hermetic feedthrough assemblies are typically manufactured with lead wires composed of platinum or a combination of platinum and iridium. The platinum or platinum/iridium material is biocompatible and creates a hermetic seal through a gold brazing process that seals any gap between the lead wires and the ceramic substrate. The use of platinum and platinum/iridium lead wires also provides for good mechanical strength, which adds to the durability of the feedthrough. However, platinum is a precious metal that creates a manufacturing cost barrier.

Materials other than platinum and platinum/iridium with suitable mechanical properties and biostability can easily be found, but suffer from poor oxidation resistance, which can result in poor electrical conduction, poor weldability and poor solderability. In order to overcome these shortcomings, the prior art has developed several techniques for applying a layer of noble metal to a non-noble metal wire core. In the case of a mechanically clad coating having a typical thickness of from 5,000 nm to 20,000 nm, the coating material is not well adhered to the wire core, which causes problems with brazing and welding.

Relatively thick coating layers can also be produced by vacuum deposition techniques. However, they produce coatings that are subjected to relatively high stresses. Therefore, the practical limitation of a vacuum deposition coating is about 2,000 nm to 5,000 nm thick.

Another prior art process involves coating a relatively thin layer about 100 nm to 1,000 nm thick on the surface of a non-noble metal wire core. While such relatively thin coatings do not suffer from the stress forces inherent in thicker coatings, regardless how they are adhered to the wire core, these relatively thin coating thicknesses are insufficient to act as a barrier to migration of the non-noble metal to the surface of the wire. Subsequent operations such as brazing, welding and soldering can expose the non-noble material to oxidation, thereby causing a non-wettable surface that cannot be soldered.

Accordingly, there is a need for a relatively low cost lead wire for incorporation into hermetic feedthrough assemblies. The lead wire must be significantly lower in cost than those made from platinum and platinum/iridium without sacrificing biocompatibility, mechanical strength and ultimately the hermeticity of the feedthrough assembly into which it is built.

SUMMARY OF THE INVENTION

A feedthrough filter capacitor assembly comprises an outer ferrule of titanium hermetically sealed to either an alumina insulator or fused glass dielectric material seated within the ferrule. Titanium is a material typically used for the ferrule. The insulative material is also hermetically sealed to at least one lead wire. A gold braze typically accomplishes these seals. That way, the feedthrough assembly prevents leakage of fluid, such as body fluid in a human implant application, past the hermetic seal at the insulator/ferrule and insulator/lead wire interfaces. In a preferred form, a filter capacitor is mounted on the insulator and electrically connected to the lead wires and to the ferrule to prevent unwanted EMI signals from traveling along the wires and entering the interior of the medical device.

As an alternative to lead wires made of platinum or platinum/iridium, there is a desire in industry to build hermetic feedthroughs with lead wires of non-noble metal materials. The primary motivation is reduced cost. However, non-noble metals are highly reactive with gold. Over time, the non-noble wire material will diffuse into the braze material and cause severe erosion of the lead wire. For example, it is known that when titanium lead wires are brazed using gold, titanium diffusion into the gold can be significant enough to cause erosion and structural damage to the titanium wire. The result is that strength and, therefore, performance of the titanium lead wire is compromised by this excessive diffusion.

As a solution, the present invention provides a functionally graded coating on a non-noble metal wire core. The metal core acts as the mechanical support for the wire and is chosen on the basis of its mechanical properties so that it is suitable for use in a hermetic feedthrough, such as a feedthrough. Additionally, the metal core is chosen for its electrical conductivity, however, that is secondary to the mechanical requirement. Importantly, the core material is processed so that an indiscrete transition from the core to a functionally graded noble metal-containing protective coating is created. The noble metal-containing coating must be thick enough to act as a barrier for material diffusion while eliminating the relatively poor adhesion inherent in a mechanically clad coating and the problems attendant with vacuum deposited materials, and the like. Once the lead wire is incorporated into the feedthrough, the functionally graded noble metal-containing coating acts as a barrier against diffusion of the core material into the braze material. Consequently, lead wires having all the beneficial attributes of platinum and platinum/iridium wire can be built into hermetic feedthroughs, but at a significantly reduced cost.

These and other objects and advantages of the present invention will become increasingly more apparent by a reading of the following description in conjunction with the appended drawings.

DETAILED DESCRIPTION OF THE PREFERRED EMBODIMENTS

Figure 1:
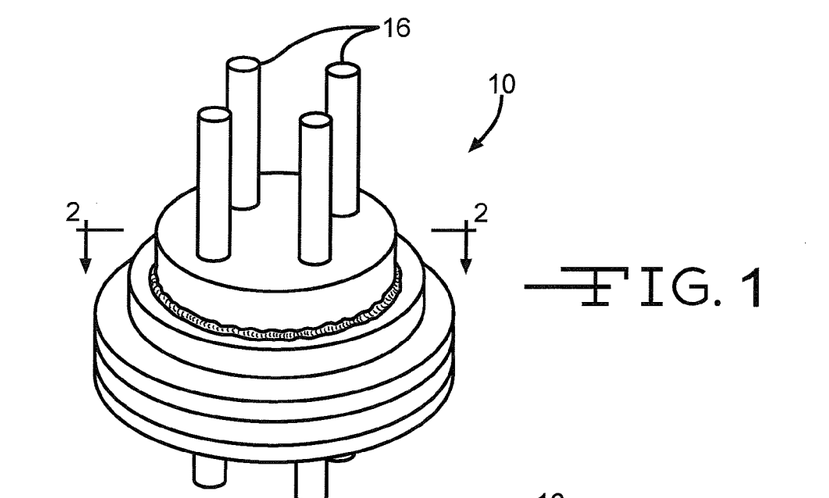
FIG. 1 is a perspective view of a hermetic feedthrough assembly embodying the novel features of the present invention.
Figure 2:
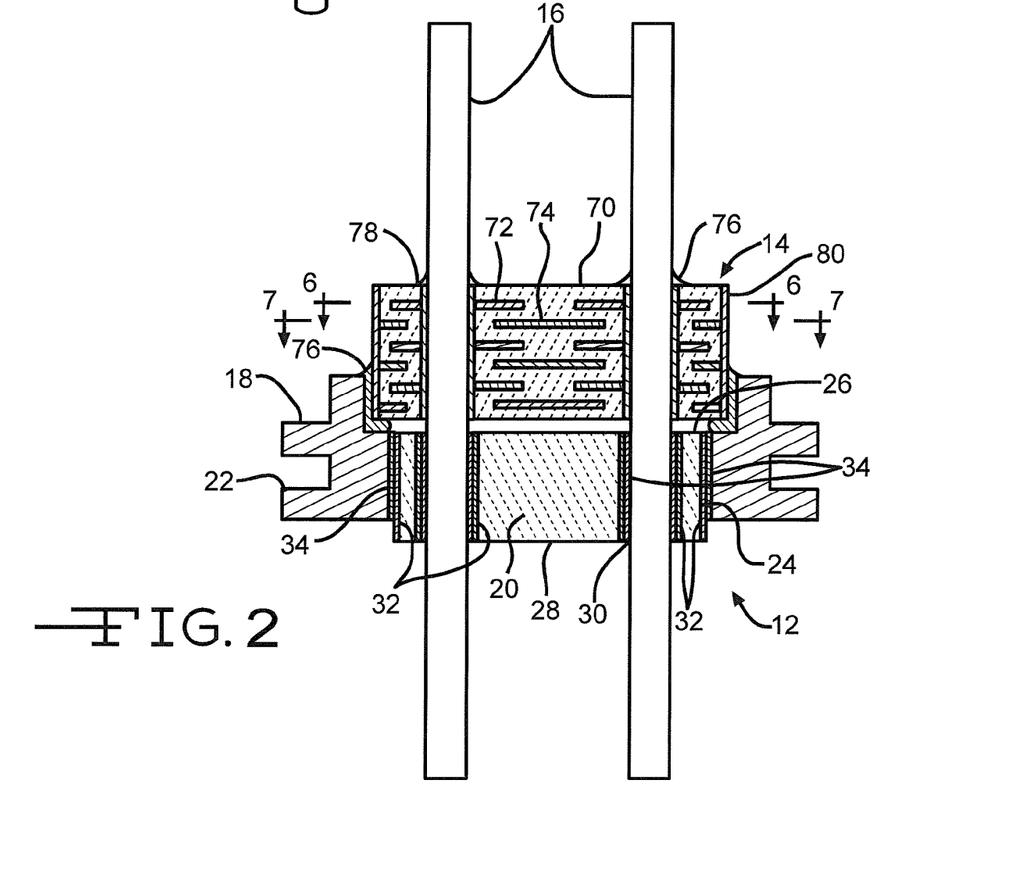
FIG. 2 is an enlarged sectional view taken along line 2-2 of FIG. 1.

Referring now to the drawings, FIGS. 1 and 2 show an internally grounded feedthrough filter capacitor assembly 10 comprising a feedthrough 12 supporting a filter discoidal capacitor 14. The feedthrough filter capacitor assembly 10 is useful with medical devices, preferably implantable devices such as pacemakers, cardiac defibrillators, cardioverter defibrillators, cochlear implants, neurostimulators, internal drug pumps, deep brain stimulators, hearing assist devices, incontinence devices, obesity treatment devices, Parkinson's disease therapy devices, bone growth stimulators, and the like. The feedthrough 12 portion of the assembly 10 hermetically seals the interior of the medical device against ingress of patient body fluids that could otherwise disrupt device operation or cause instrument malfunction and includes terminal pins or lead wires 16 that provide for coupling, transmitting and receiving electrical signals to and from a patient's heart. While not necessary for accomplishing these functions, it is desirable to attach the filter capacitor 14 to the feedthrough 12 for suppressing or decoupling undesirable EMI signals and noise transmission into the interior of the medical device along the lead wires 16. The filter capacitor 14 will be described in greater detail hereinafter.

More particularly, the feedthrough 12 of the feedthrough filter capacitor assembly 10 comprises a ferrule 18 defining a bore surrounding an insulator 20. The ferrule 18 may be of any geometry, non-limiting examples being round, rectangle, and oblong. Titanium is an electrically conductive material that is preferred for the ferrule 18. A surrounding flange 22 extends from the ferrule 18 to facilitate attachment of the feedthrough 10 to the casing (not shown) of, for example, one of the previously described implantable medical devices. The method of attachment may be by laser welding or other suitable methods.

The insulator 20 is of a ceramic material such as of alumina, zirconia, zirconia toughened alumina, aluminum nitride, boron nitride, silicon carbide, glass or combinations thereof. Preferably, the insulating material is alumina, which is highly purified aluminum oxide, and comprises a sidewall 24 extending to a first upper side 26 and a second lower side 28. The insulator 20 is also provided with bores 30 that receive the lead wires 16 passing there through. A layer of metal 32, referred to as metallization, is applied to the insulator sidewall 24 and the sidewall of the lead wire bores 30 to aid a braze material 34 in hermetically sealing between the ferrule 18 and the insulator 24 and between the lead wires 16 and the insulator 24, respectively.

Suitable metallization materials 32 include titanium, titanium nitride, titanium carbide, iridium, iridium oxide, niobium, tantalum, tantalum oxide, ruthenium, ruthenium oxide, zirconium, gold, palladium, molybdenum, silver, platinum, copper, carbon, carbon nitride, and combinations thereof. The metallization layer may be applied by various means including, but not limited to, sputtering, electron-beam deposition, pulsed laser deposition, plating, electroless plating, chemical vapor deposition, vacuum evaporation, thick film application methods, aerosol spray deposition, and thin cladding. Parylene, alumina, silicone, fluoropolymers, and mixtures thereof are also useful metallization materials.

Non-limiting examples of braze materials include gold, gold alloys, and silver. Then, if the feedthrough 10 is used where it will contact bodily fluids, the resulting brazes do not need to be covered with a biocompatible coating material. In other embodiments, if the brazes are not biocompatible, for example, if they contain copper, they are coated with a layer/coating of biocompatible/biostable material. Broadly, the biocompatibility requirement is met if contact of the braze/coating with body tissue and blood results in little or no immune response from the body, especially thrombogenicity (clotting) and encapsulation of the electrode with fibrotic tissue. The biostability requirement means that the braze/coating remains physically, electrically, and chemically constant and unchanged over the life of the patient.

The lead wires 16 of the present invention comprise a metallic core 36 selected from niobium, tantalum, nickel-titanium (NITINOL®), titanium, particularly beta titanium, titanium alloys, stainless steel, molybdenum, tungsten, palladium, palladium alloys, and combinations thereof. If desired, platinum and iridium can also be useful materials for the core 36. According to the present invention, a functionally graded protective coating 38, preferably comprising a noble metal, is provided on the surface 36A of the core material 36. This is done prior to assembling the wire 16 into a hermetic feedthrough assembly.

The functionally graded coating acts as a barrier with all the beneficial properties of a mechanically clad coating while eliminating the poor adhesion. The invention also eliminates the stresses inherent in the vacuum deposited coating process by gradually transitioning from one material to the next as opposed to discrete layers. This transitioning is done during processing and therefore the resulting coating is strongly adhered to the core wire material without subsequent processing. The preferred method for producing the functionally graded coating of the present invention utilized a high-pressure plasma nozzle operating at >100 mTorr. A suitable high pressure plasma device is described in U.S. Pat. No. 5,571,332 to Halpern, titled "Electron Jet Vapor Deposition System". This patent is incorporated herein by reference.

An electron jet vapor deposition system is preferred because the high gas pressure it generates allows for uniform coating coverage, high throughput and low gas contamination. The equipment necessary for the deposition of the functionally graded material requires multiple sputtering sources. These sources are located inside a single chamber so that they can be simultaneously used. For example, in the case of a system using three materials (A, B and C) such as is described below, the nozzles or jets must be located so that materials A and B are deposited simultaneously on the core wire substrate. Likewise, materials B and C must be capable of being deposited simultaneously.

Once vacuum and part cleanliness has been established the process of depositing the coating begins. The first step is to deposit material A, which is substantially the same as the core wire material. Sputtering material A in the plasma and allowing it to condense on the core wire substrate accomplishes this. Once a sufficient thickness of material A has been deposited, the rate of deposition for material A is reduced. In the preferred jet process, this is accomplished by decreasing the plasma power and the rate at which the coating target material is fed into the evaporator. Simultaneously, the deposition rate of material B is increased from zero to an optimum setting through the same methods. This graded coating structure is provided by simultaneously decreasing deposition rate of material A as the deposition rate of material B is increased. Similarly other materials may be added and graded to material B. In addition, other processes may be used to produce the functionally graded coating of the present invention as long as they consist of multiple materials being deposited simultaneously with the deposition rate of the respective materials being changed gradually and independently of each other.

Figure 3:
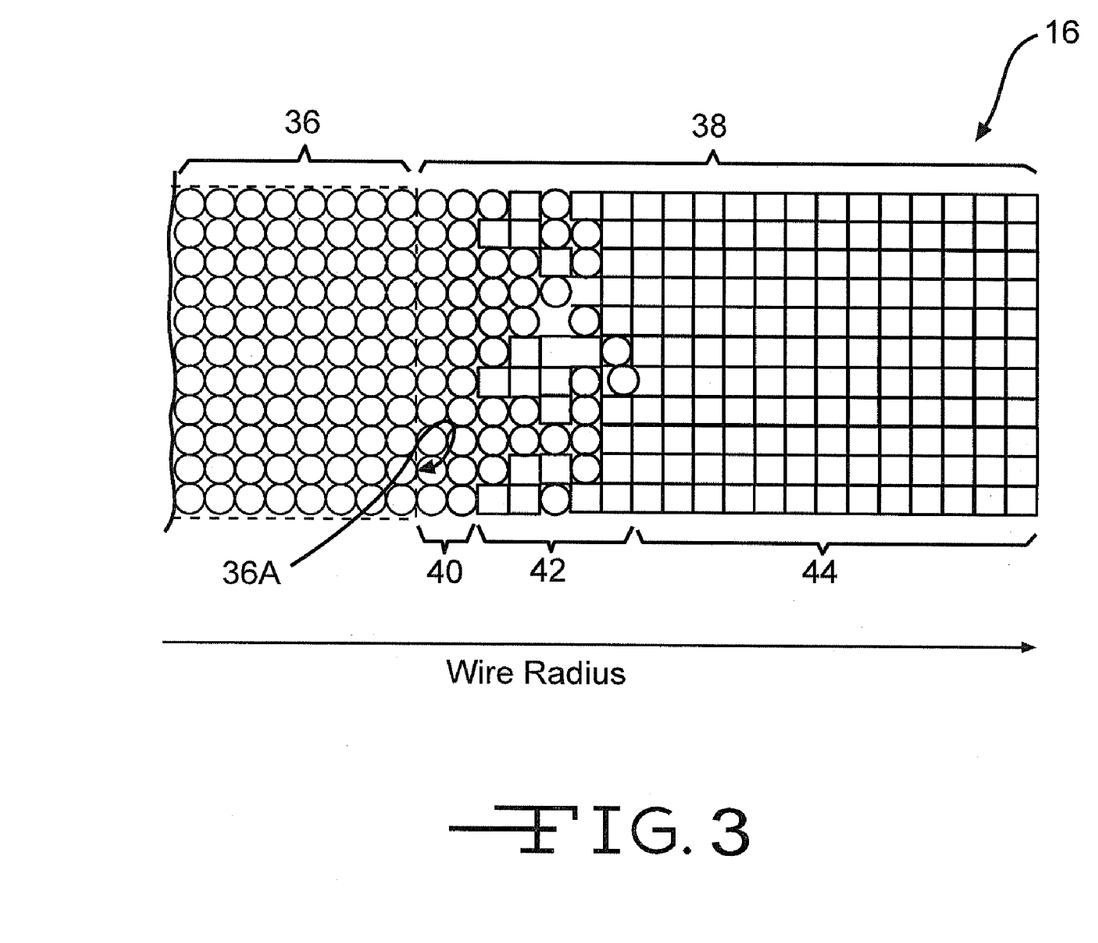
FIGS. 3 and 4 are schematic representations of lead wires according to the present invention.

FIG. 3 is a schematic drawing showing one embodiment of a lead wire 16 according to the present invention comprising a core material 36 provided with a functionally graded coating 38 comprising a two metal system. The coating 38 comprises a first, inner portion 40 (designated by circles), a second, intermediate or transition portion 42 (designated by circles and squares) and a third, outer portion 44 (designated by squares).

The first portion 40 of the coating 38 is located at the core/coating interface and is for all intents and purposes the same material as that of the core 36 (designated by circles), but is in addition to the material comprising the core of the lead wire 16. In other words, the first portion 40 of the coating 38 is 100% coating material contacted to the outer surface 36A of the core material 36. As previously described with respect to materials that are suitable for the wire core 36, the first portion 40 is selected from the group consisting of niobium, tantalum, nickel-titanium (NITINOL®), titanium, particularly beta titanium, titanium alloys, stainless steel, molybdenum, tungsten, palladium, platinum, iridium, and combinations and alloys thereof, as long as the core 36 and first portion 40 are substantially the same material. The first portion 40 of the coating is preferably a dense, adhesive and defect free layer from about 0.5 μm to about 25 μm thick.

The second, intermediate portion 42 is a transition mixture of the material comprising the first portion and a noble metal. Preferably, the intermediate portion 42 is a mixture of the same non-noble metal comprising the wire core 36 and the first portion 40 and a noble metal, such a platinum or iridium. As the thickness of the intermediate portion 42 increases spaced from the outer surface 36A of the wire core 36, there is a gradient trending toward increasingly more of the noble metal and less of the non-noble metal. The thickness of the second portion 42 preferably ranges from about 0.5 μm to about 25 μm. Non-limiting examples of suitable noble metals include gold, platinum, palladium, iridium, tantalum, ruthenium, rhodium, and combinations and alloys thereof. Then, the third, outer portion 44 is substantially pure noble metal, such as platinum or iridium. The thickness of the third portion preferably ranges from about 0.5 μm to about 25 μm.

A preferred two metal system comprises tantalum as the metal of the wire core 36 and the first portion 40 (circles) and platinum as the metal of the third portion 44 (squares).

Figure 4:
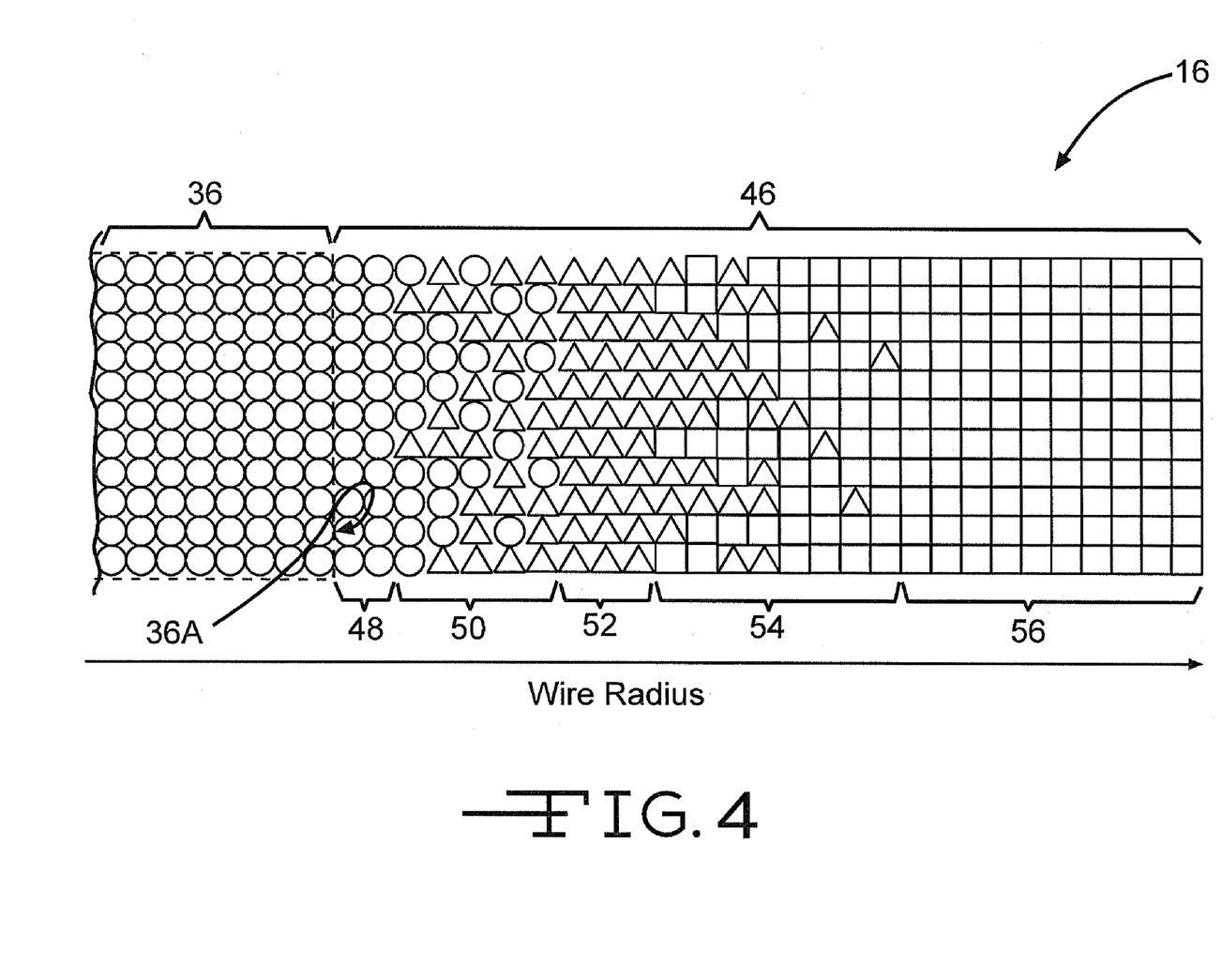

FIG. 4 is a schematic drawing showing another embodiment of a lead wire 16 according to the present invention comprising a core material 36 provided with a functionally graded coating 46 comprising a three metal system. The coating 46 comprises a first, inner portion 48 (designated by circles), a second, inner intermediate portion 50 (designated by circles and triangles), a third, outer intermediate portion 52 (designated by triangles and squares), and an outer portion 54 (designated by squares).

The first portion 48 of the coating 38 is located at the core/coating interface and is for all intents and purposes the same material as that of the core 36 (designated by circles), but is in addition to the material comprising the core of the lead wire 16. Materials that are suitable for the wire core 36 and the first portion 48 are selected from the group consisting of niobium, tantalum, nickel-titanium (NITINOL®), titanium, particularly beta titanium, titanium alloys, stainless steel, molybdenum, tungsten, palladium, platinum, iridium, and combinations and alloys thereof. The first portion 48 of the coating preferably has a thickness of from about 0.5 μm to about 25 μm thick.

The second, inner intermediate portion 50 is a mixture of the material comprising the first portion 48 and either another non-noble metal or a noble metal. Preferably, the second inner intermediate portion 50 is a transition mixture of the same non noble metal comprising the wire core 36 and the first portion 50 and a noble metal, such as titanium. As the thickness of the inner intermediate portion 50 increases spaced from the outer surface 36A of the wire core 36, there is a gradient trending toward increasingly more of the noble metal or the other non-noble metal and less of the non-noble metal comprising the core. The second, inner intermediate portion 50 has a thickness that preferably ranges from about 0.5 μm to about 25 μm. Non-limiting examples of suitable noble metals include gold, platinum, palladium, iridium, tantalum, ruthenium, rhodium, and combinations and alloys thereof.

The third intermediate portion 52 is substantially of either the non-noble metal or the noble metal comprising the mixture of the second, inner intermediate portion 50. The third intermediate portion 52 has thickness that preferably ranges from about 0.5 μm to about 25 μm.

The fourth outer intermediate portion 54 is a mixture of the non-noble metal or a noble metal material comprising the second, inner intermediate portion 50 and a noble metal. Preferably, the fourth outer intermediate portion 54 is a transition mixture of two noble metals such as titanium and platinum. As the thickness of the forth outer intermediate portion 54 increases spaced from the outer surface 36A of the wire core 36, there is a gradient trending toward increasingly more of the second noble metal, for example platinum, and less of the first noble metal, for example titanium. The fourth outer intermediate portion 54 has a thickness that preferably ranges from about 0.5 μm to about 25 μm.

In this embodiment, the functionally graded coating 46 is completed by the fifth outer portion 56, which is substantially of a pure noble metal, such as platinum. The fifth portion 56 preferably has a thickness ranging from about 0.5 μm to about 25 μm.

A preferred three metal system comprises niobium as the metal of the core wire 36 and the first portion 48 (circles), titanium as the other metal of the intermediate portions 50, 52 and 54 (triangles) and platinum as the metal of the outer portion 56 (squares).

Figure 5:
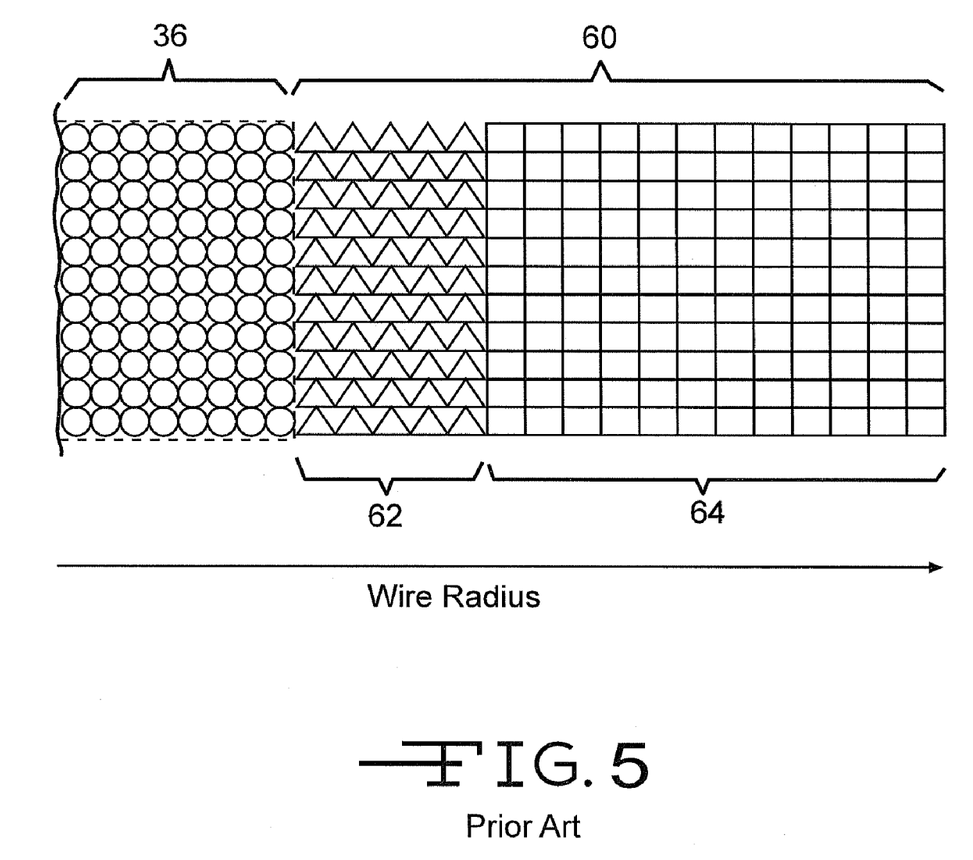
FIG. 5 is a schematic representation of a lead wire according to a prior art process.
Figure 6:
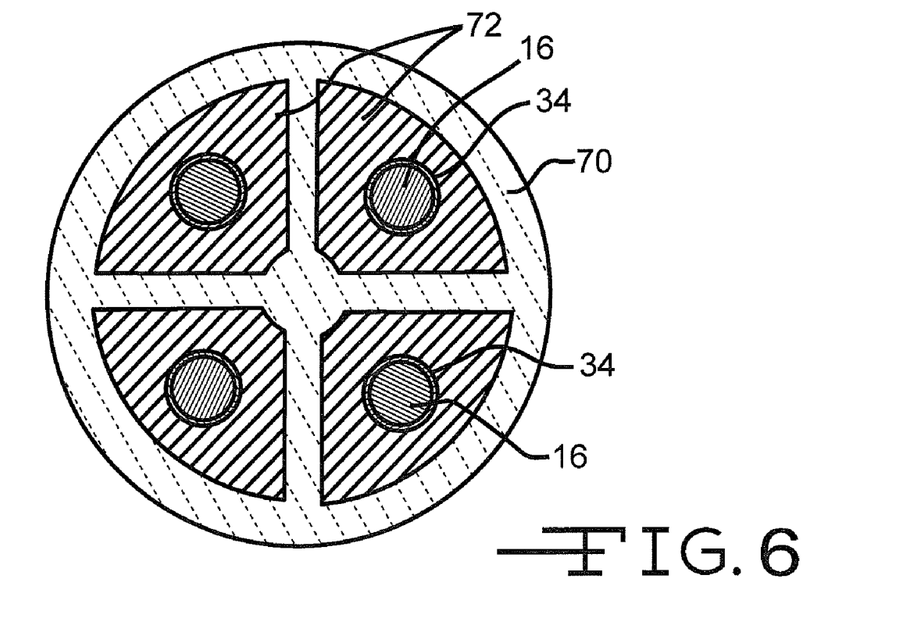
FIG. 6 is a cross-sectional view taken along line 6-6 of FIG. 2.
Figure 7:
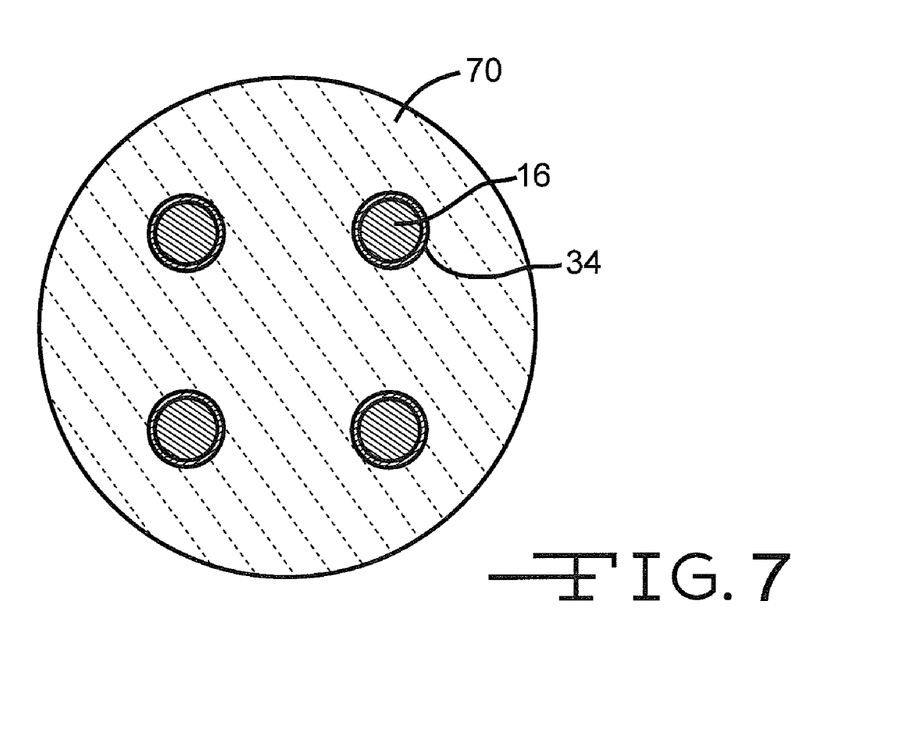
FIG. 7 is a cross-sectional view taken along line 7-7 of FIG. 2.

In contrast to the present invention, FIG. 5 is a schematic drawing showing a prior art lead wire comprising the core material 36 provided with a non-functionally graded coating 60 as a two metal system. The coating 60 comprises discrete layers of a first, inner portion 62 (designated by triangles) and a second, outer portion 64 (designated by squares). As with the exemplary embodiments of the present invention schematically illustrated in FIGS. 3 and 4, the wire core 36 is selected from the group consisting of niobium, tantalum, nickel-titanium (NITINOL®), titanium, particularly beta titanium, titanium alloys, stainless steel, molybdenum, tungsten, palladium, platinum, iridium, and combinations and alloys thereof.

The first, inner portion 62 of the prior art coating 60 is either a non-noble or a noble metal that is different than the non-noble metal of the wire core 36. There is no gradient transition between the wire core 36 and the first portion 62. Instead, they have distinct and well defined boundaries. The method of deposition of the inner portion 62 onto the wire core 36 is not necessarily limited and can be done by mechanical cladding, vacuum deposition techniques, and the like, as long as it results in a distinct boundary between the two materials.

The second, outer portion 64 of the prior art coating 60 is a noble metal that is different than the material of the inner portion 62. Again, there is no gradient transition between the material 62 and 64. Instead, they have distinct and well defined boundaries. As before, the method of deposition of the outer portion 64 onto the inner portion 62 is not necessarily limited and can be done by mechanical cladding, vacuum deposition techniques, and the like, as long as it results in a distinct boundary between the two materials. An exemplary lead wire according to the prior art comprises niobium as the wire core 36 (circles), titanium as the inner coating portion 62 (triangles) and platinum as the outer portion 64 (squares).

The problem with the prior art non-functionally graded coating is that the inner and outer portions 62, 64 of the system can be prone to delamination, spalling, sloughing, flaking, and the like. These are undesirable in many applications, especially those where the lead wire is subsequently designed into a hermetic feedthrough. In contrast, the functionally graded coating of the present invention does not suffer from these shortcomings. In all cases, the inner portion of the coating is the same material as the wire core, which results in a strong, ionic bond between the two. Then, as the coating transitions from the core material to the outer noble metal, the transitional gradient is an ionic bond that is extremely strong and capable of withstanding severe forces without delamination, spalling, sloughing, flaking and similar types of failures.

As further shown in FIGS. 1, 2, 6 and 7, a preferred form of the feedthrough filter capacitor assembly 10 includes a filter capacitor 14 that provides for filtering undesirable EMI signals before they can enter the device housing via the terminal pins 16. The filter capacitor 14 comprises a ceramic or ceramic-based dielectric monolith 70 having multiple capacitor-forming conductive electrode plates formed therein. The capacitor dielectric 70 preferably has a circular cross-section matching the cross-section of the ferrule 18 and supports a plurality of spaced-apart layers of first or "active" electrode plates 72 in spaced relationship with a plurality of spaced apart layers of second or "ground" electrode plates 74. The filter capacitor 14 is preferably joined to the feedthrough 12 adjacent to the insulator side 26 by an annular bead 76 of conductive material, such as a solder or braze ring, or a thermal-setting conductive adhesive, and the like. The dielectric 36 includes lead bores 44 provided with an inner surface metallization layer. The terminal pins 16 pass there through and are conductively coupled to the active plates 72 by a conductive braze material 78 contacting between the lead wires 16 and the bore metallization. In a similar manner, the ground plates 78 are electrically connected through an outer surface metallization 80 and the conductive material 76 to the ferrule 18.

It is appreciated that various modifications to the invention concepts described herein may be apparent to those of ordinary skill in the art without departing from the scope of the present invention as defined by the appended claims.

What is claimed is:

1. A feedthrough assembly, which comprises:
   a) an insulator of electrically non-conductive material having a height defined by an insulator sidewall extending to a first insulator end and a second insulator end, wherein the insulator has at least one lead wire bore extending from the first end to the second end thereof;
   b) a lead wire received in the lead wire bore, the lead wire having a length extending to opposed first and second ends disposed spaced from the respective first and second insulator ends;
   c) a ferrule of an electrically conductive material and comprising a ferrule opening defined by a surrounding sidewall extending to a first ferrule end and a second ferrule end, wherein the insulator is supported in the ferrule opening;
   d) a first braze material hermetically sealing the lead wire to the insulator and a second braze material hermetically sealing the insulator to the ferrule; and
   e) wherein the lead wire comprises a core of a first metal supporting a functionally graded coating comprising at least one second metal other than the first metal.

2. The feedthrough assembly of claim 1 wherein the functionally graded coating comprises, in an orientation moving radially outwardly from the core, a first portion supported on the core and of the first metal, a second portion as a mixture of the first and second metals, and a third portion of the second metal.

3. The feedthrough assembly of claim 2 wherein the first metal of the core and the first portion of the functionally graded coating are selected from a group consisting of niobium, tantalum, nickel-titanium (NITINOL®), titanium, titanium alloys, stainless steel, molybdenum, tungsten, palladium, palladium alloys, platinum, and iridium.

4. The feedthrough assembly of claim 2 wherein the second metal of the second and third portions of the functionally graded coating are selected from a group consisting of niobium, tantalum, nickel-titanium (NITINOL®), titanium, titanium alloys, stainless steel, molybdenum, tungsten, palladium, palladium alloys, platinum, iridium, gold, and combinations and alloys thereof.

5. The feedthrough assembly of claim 2 wherein the first, second and third portions of the functionally graded coating each have a thickness of from about 0.5~m to about 25 pm.

6. The feedthrough assembly of claim 2 further comprising, in an orientation moving radially outwardly from the core, a fourth portion contacting the third portion and comprising a mixture of the second metal and a third metal, and a fifth portion predominantly of the third metal.

7. The feedthrough assembly of claim 6 wherein the third metal is selected from a group consisting of gold, platinum, palladium, iridium, tantalum, ruthenium, rhodium, and combinations and alloys thereof.

8. The feedthrough assembly of claim 6 wherein the fourth and fifth portions of the functionally graded coating each have a thickness of from about 0.5 μm to about 25 μm.

9. The feedthrough assembly of claim 1 including a filter capacitor electrically connected to the lead wire and to the ferrule to decouple EMI signals.

10. The feedthrough assembly of claim 1 wherein the insulator is selected from a group consisting of alumina, zirconia, zirconia toughened alumina, aluminum nitride, boron nitride, silicon carbide, glass, and mixtures thereof.

11. The feedthrough assembly of claim 1 wherein the first and second braze materials are selected from a group consisting of gold, gold alloys, and silver.

12. The feedthrough assembly of claim 1 further including a metallization material covering the insulator sidewall and a lead wire bore, the metallization material selected from the group consisting of titanium, titanium nitride, titanium carbide, iridium, iridium oxide, niobium, tantalum, tantalum oxide, ruthenium, ruthenium oxide, zirconium, gold, palladium, molybdenum, silver, platinum, copper, carbon, carbon nitride, and mixtures thereof.

13. A wire, which comprises:
   a) a core of a first metal; and
   b) a functionally graded coating, in an orientation moving radially outwardly from the core, a first portion supported on the core and of the first metal, a second portion as a mixture of the first and second metals, and a third portion of the second metal.

14. The wire of claim 13 wherein the first metal of the core and the first portion of the functionally graded coating are selected from a group consisting of niobium, tantalum, nickel-titanium (NITINOL®), titanium, titanium alloys, stainless steel, molybdenum, tungsten, palladium, palladium alloys, platinum, and iridium.

15. The wire of claim 13 wherein the second metal of the second and third portions of the functionally graded coating are selected from a group consisting of niobium, tantalum, nickel-titanium (NITINOL®), titanium, titanium alloys, stainless steel, molybdenum, tungsten, palladium, palladium alloys, platinum, iridium, gold, and combinations and alloys thereof.

16. The wire of claim 13 wherein the first, second and third portions of the functionally graded coating each have a thickness of from about 0.5 µm to about 25 µm thick.

17. The wire of claim 13 further comprising, in an orientation moving radially outwardly from the core, a fourth portion contacting the third portion and comprising a mixture of the second metal and a third metal, and a fifth portion predominantly of the third metal.

18. The wire of claim 17 wherein the third metal is selected from a group consisting of gold, platinum, palladium, iridium, tantalum, ruthenium, rhodium, and combinations and alloys thereof.

19. The wire of claim 17 wherein the fourth and fifth portions of the functionally graded coating each have a thickness of from about 0.5 µm to about 25 µm.

20. A method for providing a wire, comprising the steps of:
   a) providing a core of a first metal; and
   b) coating the core with a functionally graded coating comprising, in an orientation moving radially outwardly from the core, a first portion of the same metal as the core and then a second metal other than the first metal.

21. The method of claim 20 including coating the functionally graded coating on the core of the wire as a plasma generated coating.

22. The method of claim 20 including providing the functionally graded coating comprising, in an orientation moving radially outwardly from the core, the first portion supported on the core and of the first metal, a second portion as a mixture of the first and second metals, and a third portion of the second metal.

23. The method of claim 20 including selecting the first metal of the core and the first portion of the functionally graded coating from a group consisting of niobium, tantalum, nickel-titanium (NITINOL®), titanium, titanium alloys, stainless steel, molybdenum, tungsten, palladium, palladium alloys, platinum, and iridium.

24. The method of claim 20 including selecting the second metal of the second and third portions of the functionally graded coating from a group consisting of niobium, tantalum, nickel-titanium (NITINOL®), titanium, titanium alloys, stainless steel, molybdenum, tungsten, palladium, palladium alloys, platinum, iridium, gold, and combinations and alloys thereof.

25. The method of claim 20 including coating the first, second and third portions of the functionally graded coating to a respective thickness of from about 0.5 µm to about 25 µm.

26. The method of claim 20 including providing the wire further comprising, in an orientation moving radially outwardly from the core, a fourth portion contacting the third portion and comprising a mixture of the second metal and a third metal, and a fifth portion predominantly of the third metal.

27. The method of claim 26 including selecting the third metal from a group consisting of gold, platinum, palladium, iridium, tantalum, ruthenium, rhodium, and combinations and alloys thereof.

28. The method of claim 26 including coating the fourth and fifth portions of the functionally graded coating to a thickness of from about 0.5 µm to about 25 µm.

29. The method of claim 20 including incorporating the wire into a feedthrough assembly, the feedthrough assembly comprising:
   a) an insulator of electrically non-conductive material having a height defined by an insulator sidewall extending to a first insulator end and a second insulator end, wherein the insulator has at least one lead wire bore extending from the first end to the second end thereof;
   b) the wire as a lead wire received in the lead wire bore, the lead wire having a length extending to opposed first and second ends disposed spaced from the respective first and second insulator ends;
   c) a ferrule of an electrically conductive material and comprising a ferrule opening defined by a surrounding sidewall extending to a first ferrule end and a second ferrule end, wherein the insulator is supported in the ferrule opening; and
   d) a first braze material hermetically sealing the lead wire to the insulator and a second braze material hermetically sealing the insulator to the ferrule.

* * * * *

UNITED STATES PATENT AND TRADEMARK OFFICE
CERTIFICATE OF CORRECTION

| | | |
|---|---|---|
| PATENT NO. | : 7,812,691 B1 | Page 1 of 1 |
| APPLICATION NO. | : 12/267932 | |
| DATED | : October 12, 2010 | |
| INVENTOR(S) | : Fisk et al. | |

It is certified that error appears in the above-identified patent and that said Letters Patent is hereby corrected as shown below:

Column 8, line 44 - "~m" should be "μm"

Column 8, line 44 - "pm" should be "μm"

Signed and Sealed this

Twenty-eighth Day of December, 2010

David J. Kappos
*Director of the United States Patent and Trademark Office*